US009566657B2

(12) United States Patent
Knoener et al.

(10) Patent No.: US 9,566,657 B2
(45) Date of Patent: Feb. 14, 2017

(54) SYSTEM AND METHOD FOR DETERMINING ATTACHMENT AND POLARITY OF A WELDING ELECTRODE

(71) Applicant: Illinois Tool Works Inc., Glenview, IL (US)

(72) Inventors: Craig Steven Knoener, Appleton, WI (US); Ronald Dewayne Woodward, Kaukauna, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 323 days.

(21) Appl. No.: 13/776,229

(22) Filed: Feb. 25, 2013

(65) Prior Publication Data

US 2013/0256289 A1 Oct. 3, 2013

Related U.S. Application Data

(60) Provisional application No. 61/616,303, filed on Mar. 27, 2012.

(51) Int. Cl.
| | |
|---|---|
| *B23K 9/10* | (2006.01) |
| *B23K 9/095* | (2006.01) |
| *B23K 37/00* | (2006.01) |
| *B23K 9/32* | (2006.01) |
| *G01R 31/02* | (2006.01) |
| *H02H 11/00* | (2006.01) |
| *G01R 31/04* | (2006.01) |

(52) U.S. Cl.
CPC ............... *B23K 9/0956* (2013.01); *B23K 9/10* (2013.01); *B23K 9/1006* (2013.01); *B23K 9/32* (2013.01); *B23K 37/006* (2013.01); *G01R 31/02* (2013.01); *H02H 11/00* (2013.01); *G01R 31/041* (2013.01)

(58) Field of Classification Search
CPC ....... B23K 37/006; B23K 9/0956; B23K 9/10; B23K 9/1006; B23K 9/32; G01R 31/02; G01R 31/041; H02H 11/00
USPC ................ 219/130.21, 130.1, 133, 129, 136, 125.1,219/125.11, 130.01, 137 PS, 137.71, 137.9, 148,219/162, 130.31, 130.32, 130.33, 137.05
See application file for complete search history.

(56) References Cited

U.S. PATENT DOCUMENTS

| | | | |
|---|---|---|---|
| 2,558,083 A | 6/1951 | Green | |
| 2,792,559 A | 5/1957 | Maberry | |
| 3,078,354 A | 2/1963 | Pettit, Jr. | |
| 3,477,001 A | 11/1969 | Spinrad | |

(Continued)

FOREIGN PATENT DOCUMENTS

| | | |
|---|---|---|
| CN | 2166908 | 6/1994 |
| CN | 1610594 | 4/2005 |

(Continued)

OTHER PUBLICATIONS

U.S. Appl. No. 13/894,761, filed May 15, 2016, Benjamine David Romenesko.

(Continued)

*Primary Examiner* — Dana Ross
*Assistant Examiner* — Ket D Dang
(74) *Attorney, Agent, or Firm* — Fletcher Yoder P.C.

(57) ABSTRACT

A welding system includes a power source configured to generate power and deliver the power to a welding electrode. The power source comprises a positive stud and a negative stud. The welding system also includes control circuitry configured to determine whether the welding electrode is properly connected to the positive and negative studs of the power source.

11 Claims, 5 Drawing Sheets

(56) References Cited

U.S. PATENT DOCUMENTS

| | | | |
|---|---|---|---|
| 3,646,311 A * | 2/1972 | Cameron | B23K 9/091 |
| | | | 219/121.46 |
| 4,097,701 A | 6/1978 | Steen | |
| 4,211,962 A | 7/1980 | Grunleitner | |
| 4,258,969 A | 3/1981 | Stallard | |
| 4,527,045 A * | 7/1985 | Nakajima et al. | 219/130.31 |
| 4,557,547 A | 12/1985 | Stuart | |
| 6,091,048 A * | 7/2000 | Lanouette et al. | 219/130.21 |
| 6,504,131 B1 * | 1/2003 | Hayes | B23K 9/0953 |
| | | | 219/130.01 |
| 6,570,130 B1 * | 5/2003 | Kooken | B23K 9/1006 |
| | | | 219/130.01 |
| 7,049,546 B2 * | 5/2006 | Thommes | 219/130.21 |
| 7,727,021 B2 | 6/2010 | Haruna | |
| 7,781,700 B2 * | 8/2010 | Harris | B23K 9/1062 |
| | | | 219/130.5 |
| 7,874,844 B1 | 1/2011 | Fitts, Jr. | |
| 7,952,051 B2 | 5/2011 | Veik | |
| 8,330,077 B2 | 12/2012 | Rappl | |
| 2004/0026393 A1 * | 2/2004 | Matiash | B23K 9/124 |
| | | | 219/137.2 |
| 2004/0070896 A1 | 4/2004 | Silverman | |
| 2006/0213887 A1 * | 9/2006 | Kaufman | B23K 9/32 |
| | | | 219/130.1 |
| 2007/0080153 A1 * | 4/2007 | Albrecht | B23K 9/10 |
| | | | 219/130.01 |
| 2008/0146064 A1 | 6/2008 | Bankstahl | |
| 2008/0149607 A1 * | 6/2008 | Albrecht | B23K 9/1006 |
| | | | 219/130.1 |
| 2008/0203075 A1 * | 8/2008 | Feldhausen | B23K 9/013 |
| | | | 219/136 |
| 2009/0008368 A1 * | 1/2009 | Beeson et al. | 219/121.39 |
| 2010/0314371 A1 | 12/2010 | Davidson et al. | |
| 2011/0049116 A1 | 3/2011 | Rappl | |
| 2011/0114611 A1 * | 5/2011 | Cole | 219/130.1 |
| 2011/0220616 A1 * | 9/2011 | Mehn et al. | 219/74 |
| 2011/0221448 A1 | 9/2011 | Sowders et al. | |
| 2012/0006792 A1 * | 1/2012 | Rozmarynowski et al. | 219/74 |
| 2013/0109231 A1 | 5/2013 | Sykes | |
| 2013/0186874 A1 | 7/2013 | Ihde | |
| 2013/0314371 A1 | 11/2013 | Lee | |
| 2014/0339202 A1 | 11/2014 | Romenesko | |

FOREIGN PATENT DOCUMENTS

| | | |
|---|---|---|
| CN | 1775444 | 5/2006 |
| CN | 101528404 | 9/2009 |
| CN | 102971105 | 3/2013 |
| EP | 1638171 | 3/2006 |
| RU | 70002 | 1/2008 |
| SU | 1758605 | 8/1992 |
| WO | 2007142874 | 12/2007 |
| WO | 2012035568 A2 | 3/2012 |

OTHER PUBLICATIONS

International Search Report from PCT application No. PC/US2014/036134, dated Nov. 5, 2014, 13 pgs.

International Search Report from PCT application No. PCT/US2013/033663 dated Jul. 5, 2013, 11 pgs.

* cited by examiner

SYSTEM AND METHOD FOR DETERMINING ATTACHMENT AND POLARITY OF A WELDING ELECTRODE

CROSS-REFERENCE TO RELATED APPLICATIONS

This application is a Non-Provisional Patent Application of U.S. Provisional Patent Application No. 61/616,303, entitled "System and Method for Determining Attachment and Polarity of a Welding Electrode", filed on Mar. 27, 2012, which is herein incorporated by reference.

BACKGROUND

The present disclosure generally relates to welding systems, and more specifically, to systems and methods to improve the operability of welding systems.

A wide range of welding systems and welding control regimes have been implemented for various purposes. For example, metal inert gas (MIG) techniques allow for formation of a continuing weld bead by feeding welding wire shielded by inert gas from a welding torch. Electrical power is applied to the welding wire and a circuit is completed through the workpiece to sustain an arc that melts the wire and the workpiece to form the desired weld.

Proper operation of the welding systems may rely on the knowledge of an operator to make appropriate electrode connections within the welding system. Unfortunately, an improper electrode connection may result in a poor quality weld with associated rework, thereby reducing the efficiency and operability of the welding system.

BRIEF DESCRIPTION

In one embodiment, a welding system includes a power source configured to generate power and deliver the power to a welding electrode. The power source comprises a positive stud and a negative stud. The welding system also includes control circuitry configured to determine whether the welding electrode is properly connected to the positive and negative studs of the power source.

In another embodiment, a method includes applying a test voltage across positive and negative studs of a power source. The method also includes detecting voltages at the positive and negative studs. The method further includes determining if a welding electrode is improperly connected to the positive stud or the negative stud by comparing the detected voltages.

In another embodiment, a welding system includes a power source configured to generate power and deliver the power to a welding electrode. The power source includes a positive stud and a negative stud. The power source also includes control circuitry configured to determine whether the welding electrode is properly connected to the positive and negative. The power source further includes an interface having a display device. The control circuitry is configured to display an alert via the display device if the welding electrode is not properly connected to the positive and negative studs.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The present disclosure is directed towards systems and methods for determining the attachment and polarity of welding electrodes. In general, the efficiency of a welding operation may be affected by the attachment of welding electrodes to a power supply. If the welding electrodes are improperly connected (e.g., if one of the welding electrodes is not connected, or if the polarity of the welding electrodes is reversed), the welding operation may be adversely affected. Accordingly, an operator interface may alert an operator of the improper connection, and the operator may take corrective action (e.g., by connecting the unconnected welding electrode, or by correcting the polarity of the welding electrodes) to improve the efficiency of the welding operation.

Figure 1:
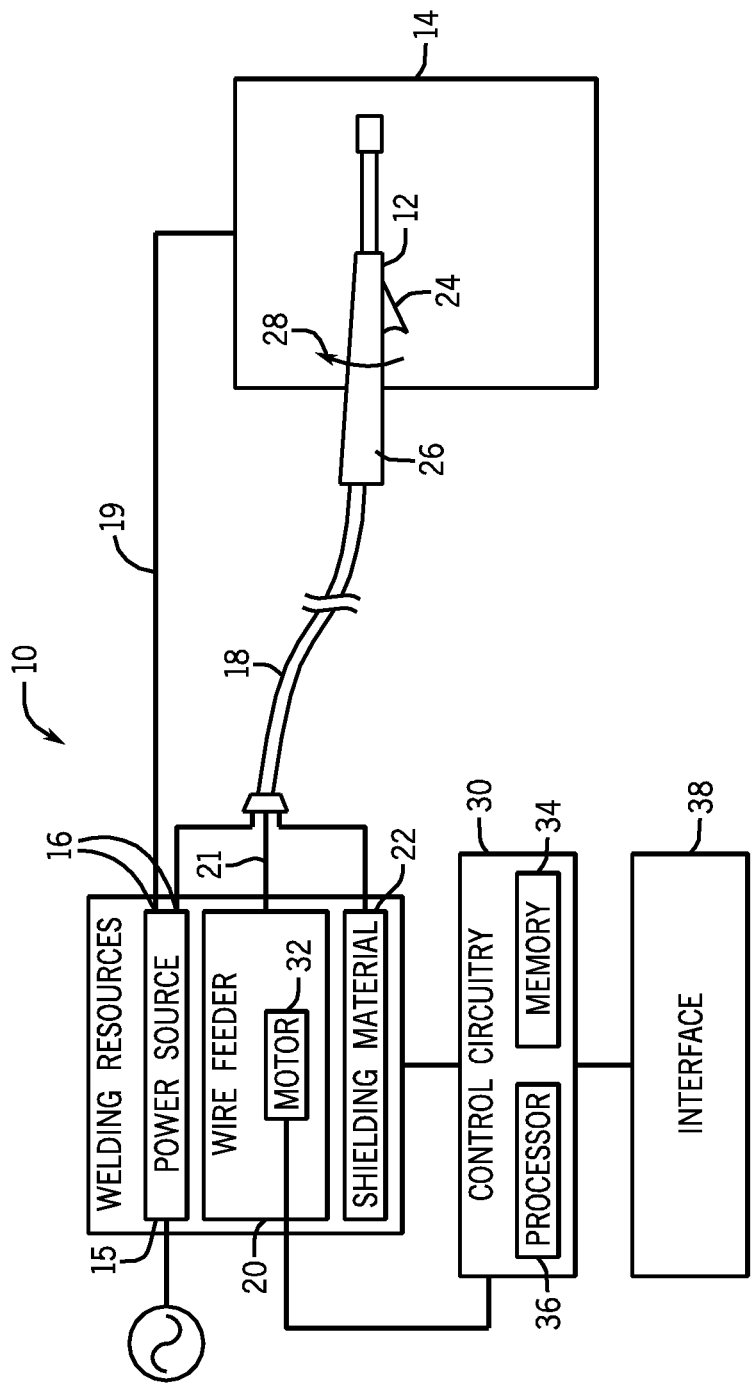
FIG. 1 is a schematic diagram of an embodiment of a welding system, wherein an interface is configured to display information about the welding system.

Turning now to the figures, FIG. 1 illustrates an exemplary welding system 10 that includes a welding torch 12 and a work piece 14. A power source 15 includes multiple studs 16 that may accommodate one or more welding electrodes to form an electrical circuit to facilitate a welding operation. As illustrated, the power source 15 provides power to the welding torch 12 via a welding torch cable 18. The welding torch cable 18 is connected to one of the studs 16. In addition, a work cable 19 is connected to one of the studs 16 (e.g., the opposite stud to which the welding torch cable 18 is not connected) and the workpiece 14. The welding torch cable 18 and the work cable 19 form a complete circuit between the power supply 15, the welding torch 12, and the workpiece 14. This electrical circuit may generate a relatively large amount of heat, causing the work piece 14 to transition to a molten state, thereby facilitating the welding operation. However, if the cables 18, 19 are connected to the studs 16 of the power source 15 improperly, the welding operation may be relatively inefficient.

To produce electrical arcing, the exemplary welding system 10 includes a wire feeder 20 that provides a consumable welding wire 21 through the welding torch cable 18 to the welding torch 12. The welding torch 12 applies electrical current to the welding wire 21 via a contact tip (not shown) located in a neck assembly of the welding torch 12, leading to arcing between the welding wire 21 and the work piece 14. It should be noted that other system arrangements and input schemes may also be implemented. For example, the welding wire may be fed from a bulk storage container (e.g., a drum) or from one or more spools outside of the wire feeder. Similarly, the wire may be fed from a "spool gun" in which the spool is mounted on or near the welding torch.

To shield the weld area from contaminants during welding, to enhance arc performance, and to improve the resulting weld, the exemplary welding system 10 includes a gas source 22 that feeds an inert shielding gas to the welding torch 12 via the welding torch cable 18. For example, the inert gas may be carbon dioxide, nitrogen, or argon. It is worth noting, however, that a variety of shielding materials, including various fluids and particulate solids, may be employed to protect the weld location. Additionally, certain wire electrodes are designed to operate without a shielding material.

Advancement of these welding resources (e.g., welding current, welding wire 21, and shielding gas) may be initiated by actuation of a trigger 24 secured to a handle 26 of the welding torch 12. By depressing the trigger 24 (arrow 28), a switch disposed within the trigger 24 is actuated, resulting in transmission of an electrical signal that commands promotion of the welding resources into the welding torch cable 18. For example, depressing the trigger 24 may send a signal to control circuitry 30, which, in turn, activates a motor 32 that advances welding wire 21 into the welding torch cable 18, opens a valve to allow the flow of shielding material, and commands the power source 15 to output the desired level of power to the wire electrode. In certain embodiments, the control circuitry 30 includes memory components 34, to store programming instructions, software programs, historical data, and so forth. The control circuitry 30 also includes a processing device, such as a processor 36, among others types of devices, to control of the welding system 10. In particular, the processor 36 may implement software instructions to determine the attachment and/or polarity of the welding torch cable 18, the workpiece cable 19, or both.

An operator may interact with a user interface 38 to adjust operating parameters of the welding system 10. To this end, the user interface 38 may include input devices such as a keypad, stylus, pushbuttons, dials, or any form of transducer that converts a physical interaction with the user interface 38 into an electrical signal input. In certain embodiments, the user interface 38 may also include a display screen to display graphics, buttons, icons, text, windows, and similar features relating to information about the welding system 10. For example, the user interface 38 may display graphical indicators of welding parameters, messages indicating a status of the welding system 10, or a combination thereof As noted previously, the user interface 38 may alert the operator if welding electrodes are improperly connected to the power source 15. For example, the welding torch cable 18 may be inadvertently disconnected from the power source 15. Additionally or alternatively, the polarities in the welding torch cable 18 and the work cable 19 may be reversed. Accordingly, the user interface 38 may display a message to alert the operator of the improper connection, and may suggest a corrective action to the operator, as described further below.

Figure 2:
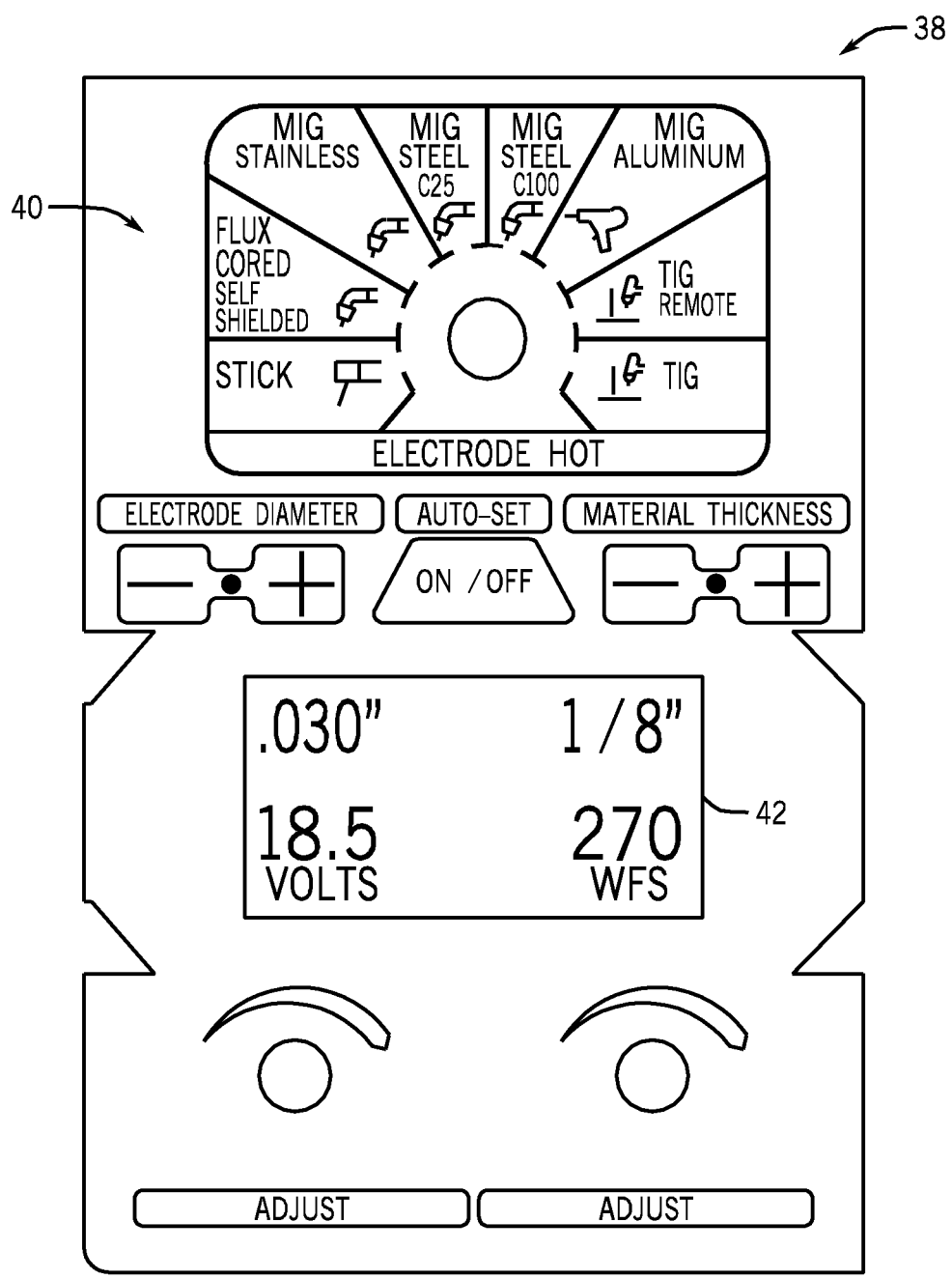
FIG. 2 is a front view of an embodiment of the user interface of FIG. 1 configured to display welding parameters.

FIG. 2 illustrates a front view of an embodiment of the user interface 38 configured to display various welding parameters of the welding system 10. As shown, the user interface 38 includes a welding process selector 40 that may enable the operator to select from one or more welding processes. For example, the welding process selector 40 may allow an operator to choose from welding processes, such as a stick welding process, a flux cored welding process, a metal inert gas (MIG) welding process, tungsten inert gas (TIG) welding process, and so forth. In addition, the welding process selector may allow the operator to select a material of the welding electrode. For example, in desiring to implement a MIG welding process, the operator may further select a stainless steel or aluminum electrode for implementing the MIG process.

The user interface 38 may include a display screen 42. The display screen 42 may be any display device capable of displaying visual graphical objects and/or alphanumeric texts relating to the setting of welding parameters, real-time operational statuses of the welding system 10, and so forth. For example, the display screen 42 may be a liquid crystal display (LCD), an organic light-emitting diode (OLED), or another suitable display screen. As illustrated, the display screen 42 may display various welding parameters of the welding system 10, including a welding wire diameter (e.g., 0.030"), material thickness (e.g., ⅛"), power source welding voltage (e.g., 18.5 volts), and wire feed speed (e.g., 270 inches per minute). Additionally or alternatively, the display screen 42 may display messages relating to a status of the connection of welding electrodes (e.g., the welding torch cable 18 and/or the work cable 19), as discussed further below in FIG. 3.

Figure 3:
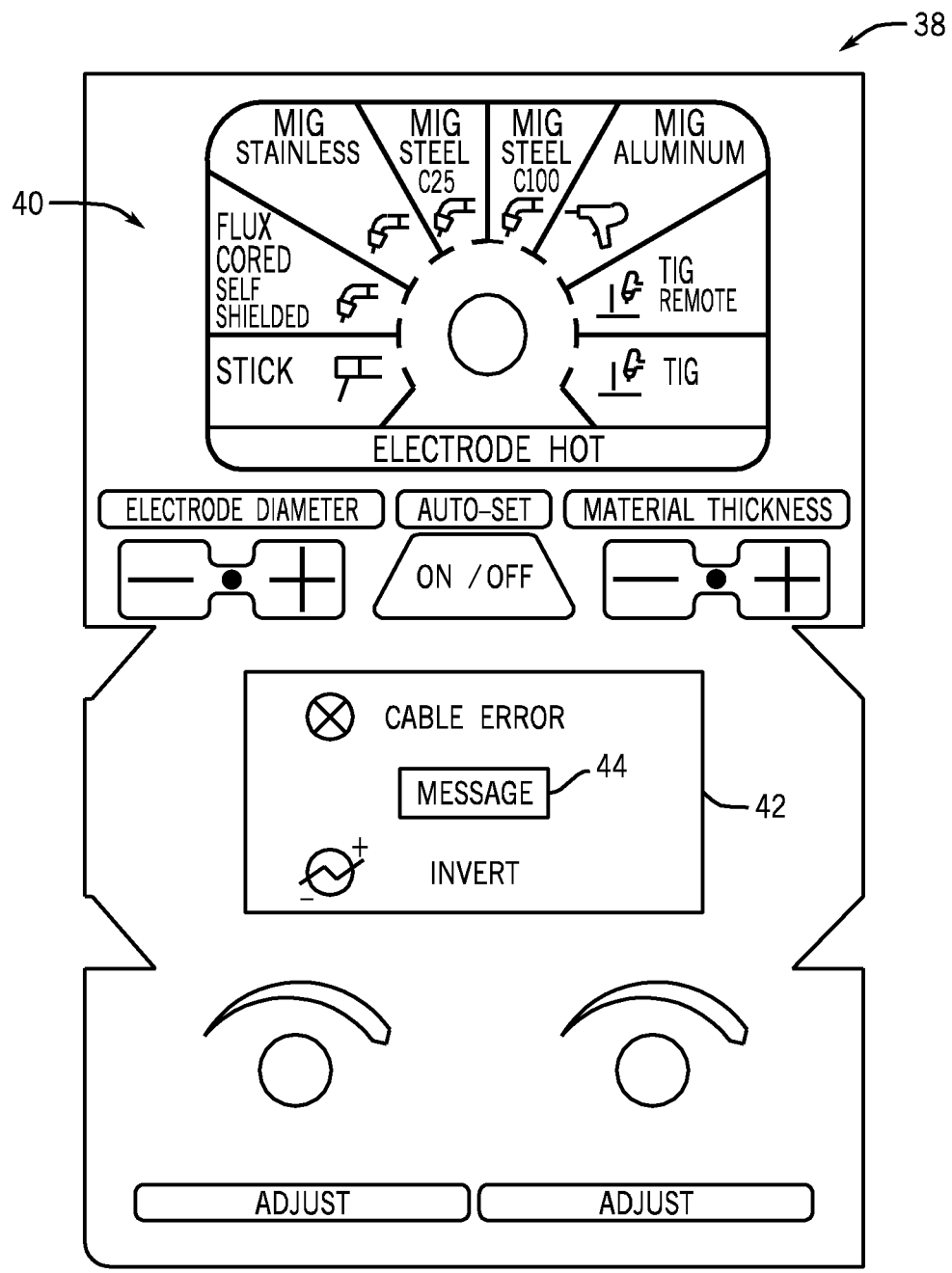
FIG. 3 is a front view of an embodiment of the user interface of FIG. 1 configured to display status information regarding electrode connections.

FIG. 3 is a front view of the user interface 38 configured to display status information regarding connections of the welding torch cable 18 and/or the work cable 19. In particular, the user interface 38 may display graphical objects and/or alphanumeric texts relating to the status of the welding system 10. For example, the user interface 38 may display a message 44 indicating an improper welding electrode connection. In certain embodiments, the control circuitry 30 may detect that the welding torch cable 18 has been disconnected from one of the studs 16 of the power supply 15. The message 44 on the user interface 38 may alert the operator to the disconnected welding electrode. In addition, the message 44 may include a suggested action to correct the welding electrode connections. Further, the user interface 38 may be configured to selectively alternate between displaying welding parameters (FIG. 2) and electrode status information (FIG. 3).

In certain embodiments, the control circuitry 30 may detect that the polarities of the welding torch electrodes are reversed. The message 44 may suggest that the operator swap the welding electrodes on the studs 16, which may result in a corrected polarity. As may be appreciated, the polarity of the welding electrodes may be partially dependent on the welding process and/or other parameters selected by the welding process selector 40. For example, in a MIG welding process, the welding torch cable 18 may typically be connected to a positive output stud 50 (FIG. 4) of the power source 15, and the work cable 19 may be connected to a negative output stud 52 (FIG. 4) of the power source 15. In contrast, in a flux cored welding process, the welding torch cable 18 may typically be connected to the negative output stud 52, and the work cable 19 may be attached to the positive output stud 50. Further, in a stick or TIG welding process, the welding torch cable 18 may not be attached to any of the studs 16 on the power source 15. Information about default or standard connections related to the various welding processes may be stored in the memory components 34 of the control circuitry 30.

The response of the welding system 10 to a detection of an improper electrode connection may vary based on the type of welding process. For example, in a MIG welding process, the welding torch cable 18 may typically be connected to the positive output stud 50, and the work cable 19 may be connected to the negative output stud. If one of the welding electrodes is disconnected, the display screen 42 may alert the operator of a disconnected electrode and the control circuitry 30 may prevent operation of the welding system 10 (e.g., disable the welding system 10 from producing and delivering a welding output). However, if the polarity of the welding electrodes is reverse, the display screen 42 may alert the operator of the reversed polarity, but may continue to allow the welding system 10 to operate. As may be appreciated by one skilled in the art, there are some applications in which a reversed electrode polarity is desirable.

In a flux cored welding process, the welding torch cable 18 may typically be connected to the negative output stud 52, and the work cable 19 may be attached to the positive output stud 50. If one of the welding electrodes is disconnected, the display screen 42 may alert the operator of a disconnected electrode and the control circuitry 30 may prevent operation of the welding system 10. However, if the polarity of the welding electrodes is reverse, the display screen 42 may alert the operator of the reversed polarity, but may continue to allow the welding system 10 to operate.

In a stick or TIG welding process, the welding torch cable 18 may not be attached to the positive output stud 50 or the negative output stud 52. If the welding torch cable 18 is connected to either stud 50, 52, the display screen 42 may alert the operator that the electrode should not be attached and the control circuitry 30 may prevent operation of the welding system 10.

The responses of the welding system 10 to a detection of an improper electrode connection are given by way of example only, and are not intended to be limiting. Indeed, various embodiments of the control circuitry 30 may detect improper electrode connections differently, and may also respond to these detections differently. Detection and correction of improper welding electrode connections may improve the efficiency of the welding operation, as discussed further below in FIG. 4.

Figure 4:
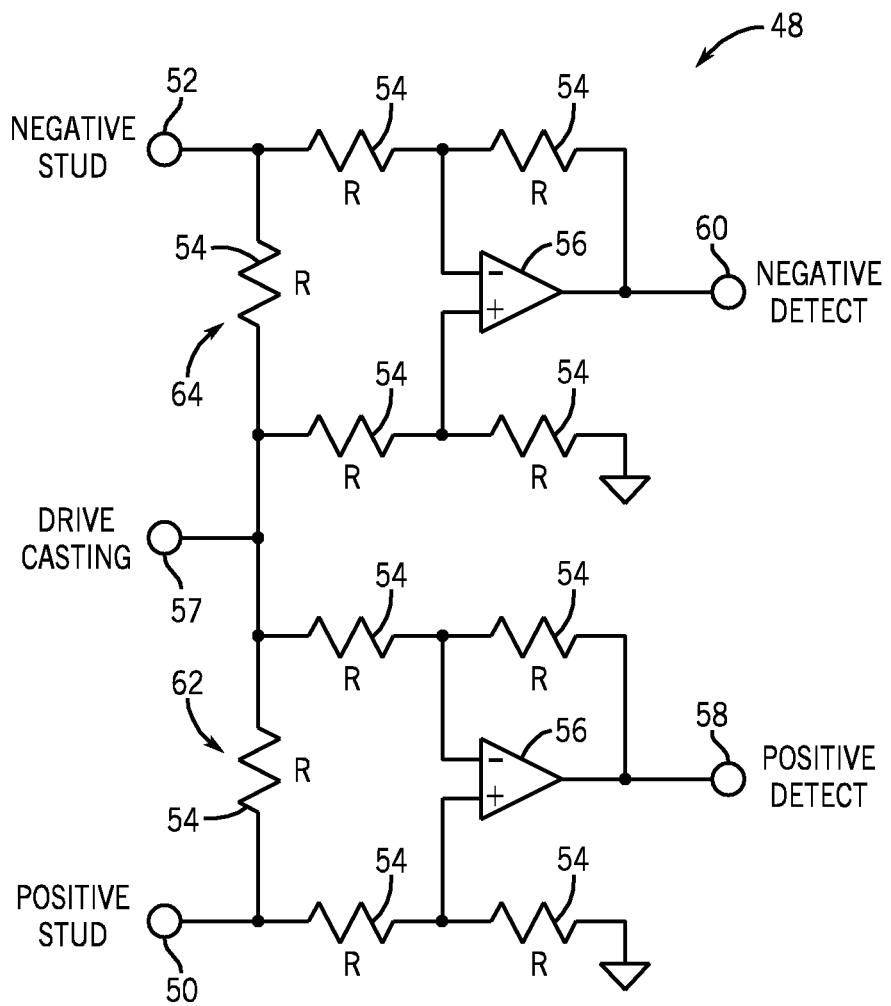
FIG. 4 is a schematic diagram illustrating circuitry to detect voltages to determine attachment and polarity of a welding electrode.

FIG. 4 is an embodiment of detection circuitry 48 that may detect when the welding electrodes have been improperly connected. In certain embodiments, the detection circuitry 48 may be a portion of the control circuitry 30. As generally discussed above, an improperly connected electrode may include a disconnected welding electrode, a reversed polarity of the welding electrodes, a welding electrode that should not be connected, or a combination thereof. As illustrated, the detection circuitry 48 is coupled to the positive output stud 50 and the negative output stud 52. Further, the detection circuitry 48 may include one or more resistors 54 and one or more operational amplifiers 56. The resistance of each of the resistors may vary according to design-specific implementations. A drive casting 57 may be moveably coupled to the detection circuitry 48, such that the drive casting 57 may be connected to the positive output stud 50 or the negative output stud 52. The network of resistors 54 and operational amplifiers 56 may enable a voltage to be detected at a positive detect net 58 and a negative detect net 60.

For example, a test voltage or switched current limited voltage (e.g., 30 V) may be applied across the positive output stud 50 and the negative output stud 52 of the power source 15. If a drive casting 57 is not attached to either of studs 50, 52, the voltages detected by the positive detect net 58 and the negative detect net 60 may be approximately equal. However, if the drive casting 57 is connected to either of the studs 50, 52, the voltages detected at the nets 58, 60 may be unequal. For example, in a MIG welding process, the welding torch cable 18 may be connected to the positive stud 50, and the work cable 19 may be connected to the negative output stud 52.

A switched current limited voltage (e.g., 30 V) is placed across the output studs 50, 52 of the welding power source 15. A dividing resistor 62 is placed between the positive output stud 50 of the welding power source 15 and the wire feed housing. Another dividing resistor 64 is placed between the negative output stud 52 of the welding power source 15 and the wire feed housing.

When the wire feed housing cable (e.g., the welding torch cable 18) is attached to the positive output stud 50 of the welding power source 15, the voltage across them is pulled low, ideally zero. When the wire feed housing cable 18 is attached to the negative output stud 52 of the welding power source 15, the voltage across them is pulled low, ideally zero. When the wire feed housing cable 18 is not attached to either output stud 50, 52 of the welding power source 15, the voltage across the wire feed housing to either output stud 50, 52 of the welding power source 15 is not pulled low, ideally half the switched current limited voltage (e.g., 15 V) across the output studs 50, 52 of the welding power source 15.

In the MIG welding process, in most welding conditions, the wire feed housing cable 18 should be attached to the positive output stud 50 of the welding power source 15 and the work cable 19 should be attached to the negative output stud 52 of the welding power source 15. If the wire feed housing cable 18 is not attached to either welding source output stud 50, 52, the welding power source 15 prevents operation, and the operator is alerted (e.g., via the interface 38) until the attachment is corrected. If the wire feed housing cable 18 is attached to the incorrect welding power source output stud 50, 52, the operator is alerted, but the welding power source 15 does not prevent operation because there are a few rare instances where this is desirable.

In the flux cored welding process, in most welding conditions, the wire feed housing cable 18 should be attached to the negative output stud 52 of the welding power source 15 and the work cable 19 should be attached to the positive output stud 50 of the welding power source 15. If the wire feed housing cable 18 is not attached to either welding source output stud 50, 52, the welding power source 15 prevents operation, and the operator is alerted (e.g., via the interface 38) until the attachment is corrected. If the wire feed housing cable 18 is attached to the incorrect welding power source output stud 50, 52, the operator is alerted, but the welding power source does not prevent operation because there are a few rare instances where this is desirable.

In either the stick or TIG welding processes, the wire feed housing cable 18 should not be attached to either welding source output stud 50, 52. If the wire feed housing cable 18 is attached to either welding source output stud 50, 52, the welding power source prevents operation, and the operator is alerted until the wire feed housing cable 18 is removed from the welding source output stud 50, 52.

Figure 5:
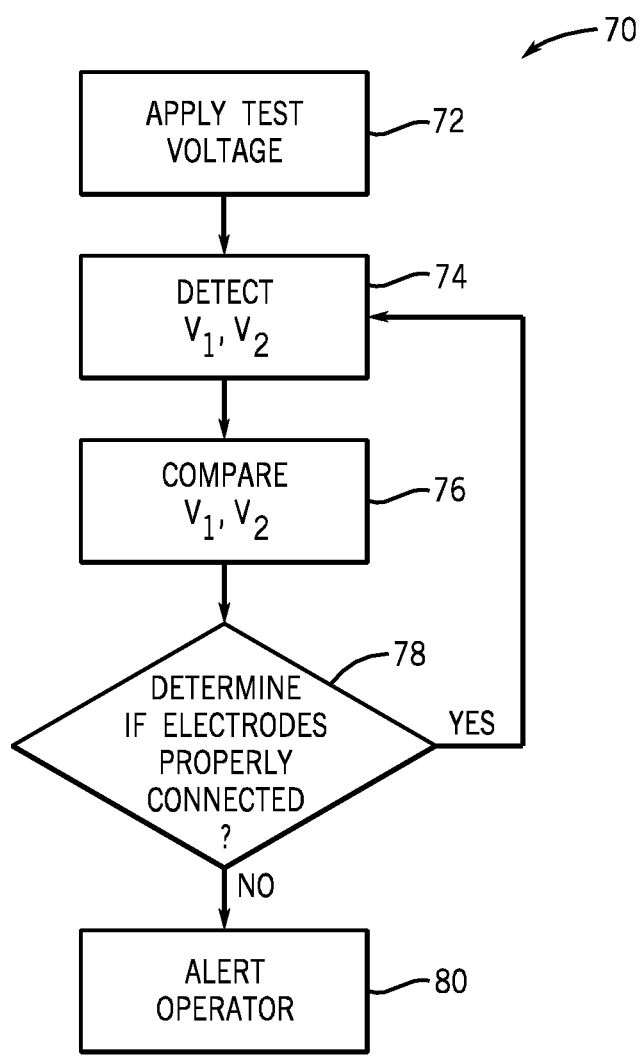
FIG. 5 is a flowchart illustrating an embodiment of a method to determine attachment and polarity of a welding electrode.

FIG. 5 is a flowchart of an embodiment of a process 70 that may be used to alert an operator to an improperly connected welding electrode. The control circuitry 30 may apply (block 72) a test voltage across the positive output stud 50 and the negative output stud 52. The control 30 circuitry may detect (block 74) voltages at the positive and negative detect nets 58, 60. The control circuitry 30 may then compare (block 76) the detected voltages to determine (block 78) if one or more welding electrodes are improperly connected. If the control circuitry 30 has determined (block 78) that one or more welding electrodes are improperly connected, the control circuitry 30 may alert (block 80) the operator of the improper connection using the user interface 38. For example, the control circuitry 30 may send an electrical signal to the user interface 38 to instruct the user interface to display the message 44 related to the improper connection. In certain embodiments, the process 70 may be initiated by pressing a button on the user interface 38. Additionally or alternatively, the process 70 may be performed continuously to improve the likelihood that the welding electrodes are properly connected, thereby increasing the operability and efficiency of the welding operation.

In certain embodiments, colors may be used (e.g., on the display device 42 of the interface 38) to provide guidance to make the correct electrode and work connections. For example, the wire feed housing cable 18 may be colored red, and the work cable 19 may be colored blue. The process selection for MIG would show the positive output stud 50 as red, and the output negative stud 52 as blue. Likewise, the process selection for TIG would show the positive output stud 50 as blue, and the negative output stud 52 as red.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A welding system, comprising:
a power source configured to generate power and deliver the power to a welding electrode, wherein the power source comprises a positive stud and a negative stud; and
control circuitry configured to determine whether the welding electrode is properly connected to the positive and negative studs of the power source based at least in part on a type of welding selected via a user interface of the welding system, wherein the type of welding selected is one of a plurality of welding processes, and wherein the control circuitry comprises memory comprising information related to default or standard connections of the welding electrode to the positive and negative studs for each of the plurality of welding processes.

2. The welding system of claim 1, comprising a display device of the user interface, wherein the control circuitry is configured to display an alert via the display device when the welding electrode is not properly connected to the positive and negative studs.

3. The welding system of claim 2, wherein the control circuitry is configured to display the alert via the display device when a polarity of the welding electrode is not appropriate for the type of welding selected via the user interface.

4. The welding system of claim 2, wherein the control circuitry is configured to display the alert via the display device when the welding electrode is improperly connected to either the positive stud or the negative stud for the type of welding selected via the user interface.

5. The welding system of claim 2, wherein the control circuitry is configured to display a suggested corrective action via the display device.

6. The welding system of claim 1, wherein the control circuitry is configured to disable delivery of power from the power source to the welding electrode when the welding electrode is disconnected from the positive and negative studs.

7. The welding system of claim 6, wherein the control circuitry is configured to selectively enable or disable delivery of power from the power source to the welding electrode when a polarity of the welding electrode is not appropriate for the type of welding selected via the user interface, wherein the control circuitry determines whether to selectively enable or disable the delivery of power based on the type of welding selected.

8. A welding system, comprising:
a power source configured to generate power and deliver the power to a welding electrode, wherein the power source comprises:
a positive stud and a negative stud;
control circuitry configured to determine whether the welding electrode is properly connected to the positive and negative studs, wherein the control circuitry comprises a memory; and
an interface having a display device, wherein the control circuitry is configured to display an alert via the display device when the welding electrode is not properly connected to the positive and negative studs based at least in part on a type of welding selected via the interface, wherein the type of welding selected is one of a plurality of welding processes, and wherein the memory comprises information related to default or standard connections of the welding electrode to the positive stud and the negative stud for each of the plurality of welding processes.

9. The welding system of claim 8, wherein the control circuitry is configured to display the alert via the display device when the welding electrode is disconnected from either the positive stud or the negative stud.

10. The welding system of claim 8, wherein the control circuitry is configured to display the alert via the display device when a polarity of the welding electrode is not appropriate for the type of welding selected via the interface.

11. The welding system of claim 8, wherein the control circuitry is configured to display the alert via the display device when the welding electrode is improperly connected to either the positive stud or the negative stud for the type of welding selected via the interface.

\* \* \* \* \*